United States Patent
Darmawan et al.

(10) Patent No.: US 7,984,285 B2
(45) Date of Patent: Jul. 19, 2011

(54) INFORMATION HANDLING SYSTEM PORT SECURITY

(75) Inventors: Ardian Darmawan, Round Rock, TX (US); Curtis Ray Genz, Round Rock, TX (US); Clay Phennicie, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 701 days.

(21) Appl. No.: 12/037,458

(22) Filed: Feb. 26, 2008

(65) Prior Publication Data

US 2009/0212844 A1     Aug. 27, 2009

(51) Int. Cl.
*G06F 9/00* (2006.01)
*G06F 7/04* (2006.01)
*G08B 29/00* (2006.01)

(52) U.S. Cl. ................. 713/2; 726/4; 726/34
(58) Field of Classification Search ............... 713/2
See application file for complete search history.

(56) References Cited

U.S. PATENT DOCUMENTS

| | | | |
|---|---|---|---|
| 6,067,628 A | 5/2000 | Krithivas et al. | |
| 6,124,750 A | 9/2000 | Alleven et al. | |
| 6,304,108 B1 | 10/2001 | Inn | |
| 6,351,809 B1 * | 2/2002 | St. Pierre et al. | 713/1 |
| 6,396,311 B2 | 5/2002 | Inn | |
| 6,573,693 B2 | 6/2003 | Okamoto | |
| 6,708,126 B2 | 3/2004 | Culler et al. | |
| 6,920,553 B1 * | 7/2005 | Poisner | 713/2 |
| 6,970,351 B2 * | 11/2005 | Perez et al. | 361/679.57 |
| 7,161,393 B1 | 1/2007 | Potanin et al. | |
| 7,196,548 B2 | 3/2007 | Anders et al. | |
| 7,233,258 B1 | 6/2007 | Gelinas | |
| 7,506,219 B2 * | 3/2009 | Bhesania et al. | 714/57 |
| 7,552,475 B2 * | 6/2009 | Piwonka et al. | 726/22 |
| 2002/0109666 A1 | 8/2002 | Lee et al. | |
| 2005/0010811 A1 * | 1/2005 | Zimmer et al. | 713/201 |
| 2005/0240712 A1 * | 10/2005 | Klein | 710/313 |
| 2006/0160395 A1 * | 7/2006 | Macauley et al. | 439/344 |
| 2007/0168574 A1 * | 7/2007 | Martinez et al. | 710/15 |

* cited by examiner

*Primary Examiner* — Suresh K Suryawanshi
(74) *Attorney, Agent, or Firm* — Haynes and Boone, LLP

(57) ABSTRACT

A port securing module includes a power gate that is operable to be coupled in series to a power source and to a load. A resistor is coupled in parallel to the power gate. An operational amplifier includes an inverting input and a non-inverting input that couple the operational amplifier in parallel to each of the power gate and the resistor. The operational amplifier also includes an output that is operable to indicate whether a load is coupled to the power gate and, if a load is coupled to the power gate, supply a voltage to activate the power gate such that power is supplied to the load.

14 Claims, 4 Drawing Sheets

INFORMATION HANDLING SYSTEM PORT SECURITY

BACKGROUND

The present disclosure relates generally to information handling systems, and more particularly to security for ports on an information handling system.

As the value and use of information continues to increase, individuals and businesses seek additional ways to process and store information. One option is an information handling system (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

For IHSs that are shared by numerous users or used by businesses, system administrators may have the desire to restrict the usage of input/output (I/O) ports (e.g., USB ports) on the IHS in order to limit problems such as data loss, copying of sensitive data to external devices, or booting from external devices. However, some devices (e.g., keyboards, mouses, and/or other input devices) may be desirable on such I/O ports, whereas other devices (e.g., flash drives, hard drives, and other storage media) may be undesirable on such I/O ports.

Accordingly, it would be desirable to provide security for ports on an IHS.

SUMMARY

According to one embodiment, a port securing module includes a power gate that is operable to be coupled in series to a first power source and to a load, a resistor coupled in parallel to the power gate, and an operational amplifier including an inverting input and a non-inverting input that couple the operational amplifier in parallel to each of the power gate and the resistor, the operational amplifier also including an output that is operable to indicate whether a load is coupled to the power gate and, if a load is coupled to the power gate, to supply a voltage to activate the power gate such that power is supplied to the load.

BRIEF DESCRIPTION OF THE DRAWINGS

FIG. 1b is a schematic view illustrating an embodiment of a port security switch included in the IHS of FIG. 1a.

DETAILED DESCRIPTION

For purposes of this disclosure, an IHS may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an IHS may be a personal computer, a PDA, a consumer electronic device, a network server or storage device, a switch router or other network communication device, or any other suitable device and may vary in size, shape, performance, functionality, and price. The IHS may include memory, one or more processing resources such as a central processing unit (CPU) or hardware or software control logic. Additional components of the IHS may include one or more storage devices, one or more communications ports for communicating with external devices as well as various I/O devices, such as a keyboard, a mouse, and a video display. The IHS may also include one or more buses operable to transmit communications between the various hardware components.

Figure 1A:
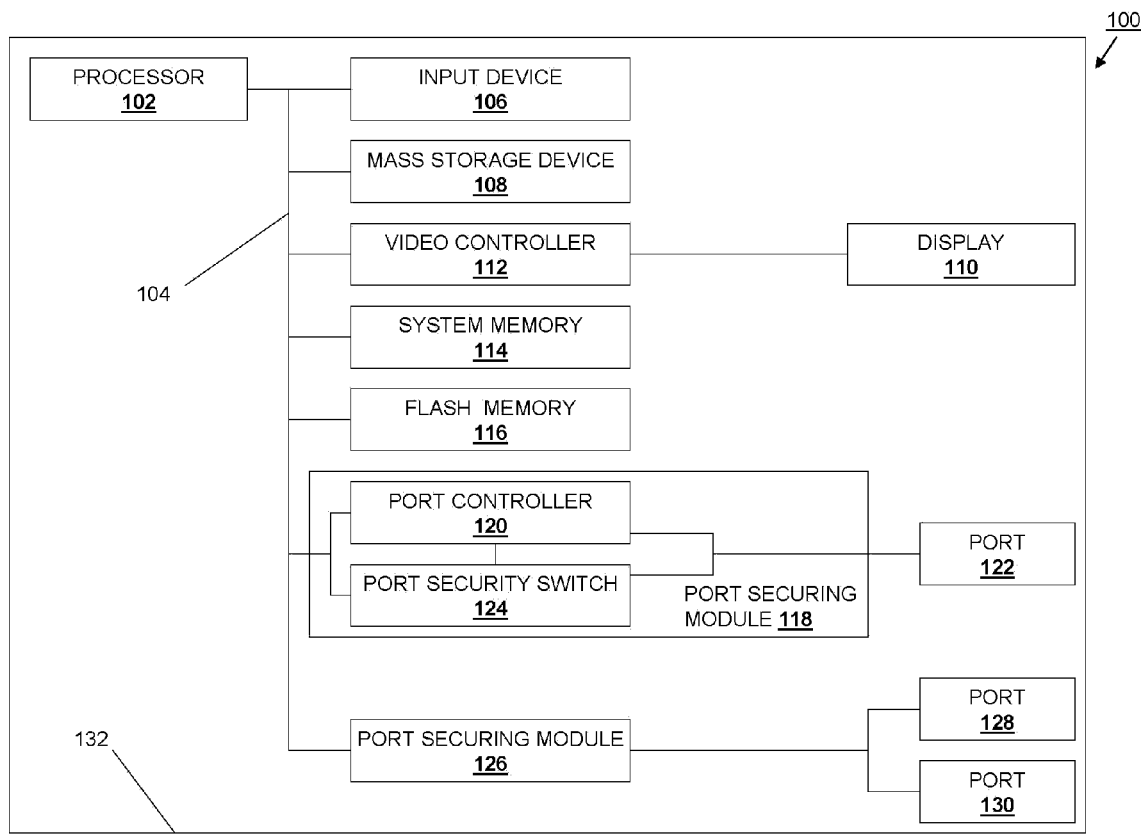
FIG. 1a is a schematic view illustrating an embodiment of an IHS.

In one embodiment, IHS 100, FIG. 1a, includes a processor 102, which is connected to a bus 104. Bus 104 serves as a connection between processor 102 and other components of IHS 100. An input device 106 is coupled to processor 102 to provide input to processor 102. Examples of input devices include keyboards, touchscreens, and pointing devices such as mouses, trackballs and trackpads, and/or a variety of other input devices known in the art. Programs and data are stored on a mass storage device 108, which is coupled to processor 102. Examples of mass storage devices may include hard discs, optical discs, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. A flash memory 116 is coupled to the processor 102 to provide the processor 102 with Basic Input/Output System (BIOS) executable instructions during boot of the IHS 100. In an embodiment, firmware or initialization code other than BIOS may be used in accordance with the present disclosure. A port-securing module 118 is coupled to the processor 102 and includes a port controller 120 coupled to a port 122 to which a device (not illustrated) may be coupled. The port-securing module 118 also includes a port security switch 124 that is coupled to the processor 102, the port controller 120, and the port 122. The port security switch 122 is described in more detail below. In an embodiment, additional port securing modules, such as port securing module 126, that are substantially similar in design and operation to the port securing modular 118, may be coupled to one or more ports, such as ports 128 and 130. In an embodiment, any of the ports 122, 128 and 130 may be, for example, a Universal Serial Bus (USB) port, an External Serial Advanced Technology Attachment (ESATA) port, a PS/2 port, a Firewire port, and/or a variety of other I/O ports known in the art for which security may be desired. In the discussion below, the port-securing module 118 is a representative port-securing module, and the port 122 is a representative port. A chassis 132 houses some or all of the components of the IHS 100. It should be understood that other buses and intermediate circuits may be deployed between the components described above and processor 102 to facilitate interconnection between the components and the processor 102.

Figure 1B:
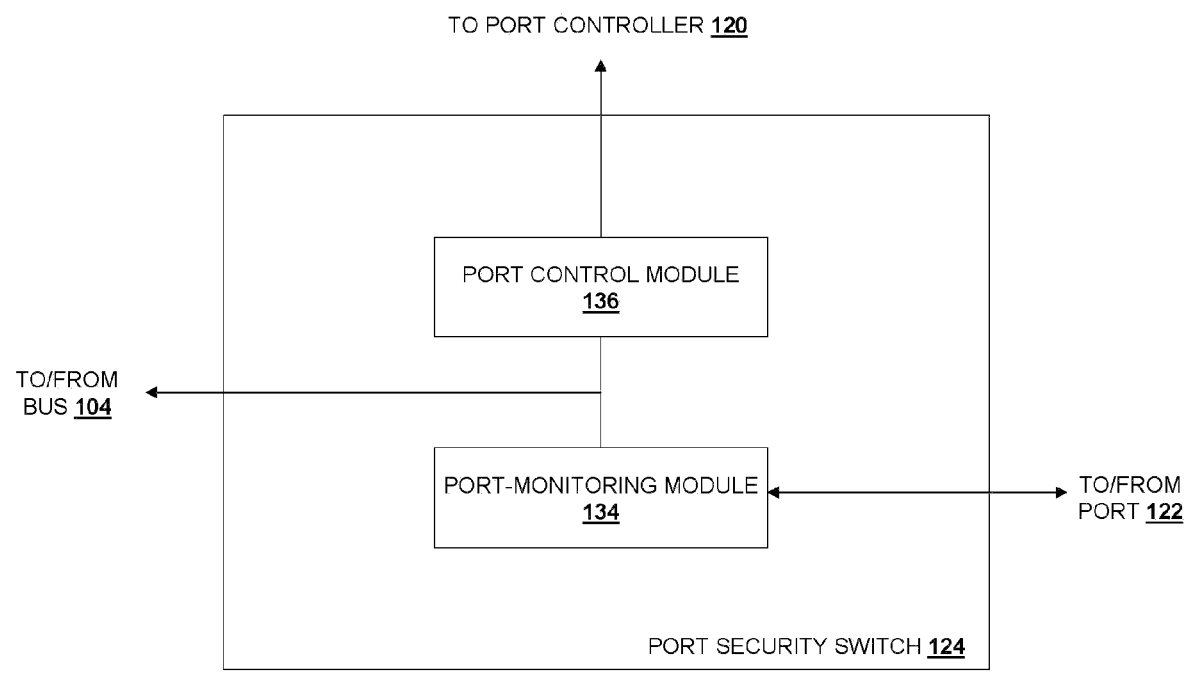

Referring now to FIG. 1a and 1b, the port security switch 124 is illustrated in more detail. The port security switch 124 includes a port-monitoring module 134 that is coupled to the bus 104, the port 122, and to a port control module 136. The port control module 136 is coupled to the port-monitoring module 134, the bus 104, and the port controller 120.

Figure 1C:
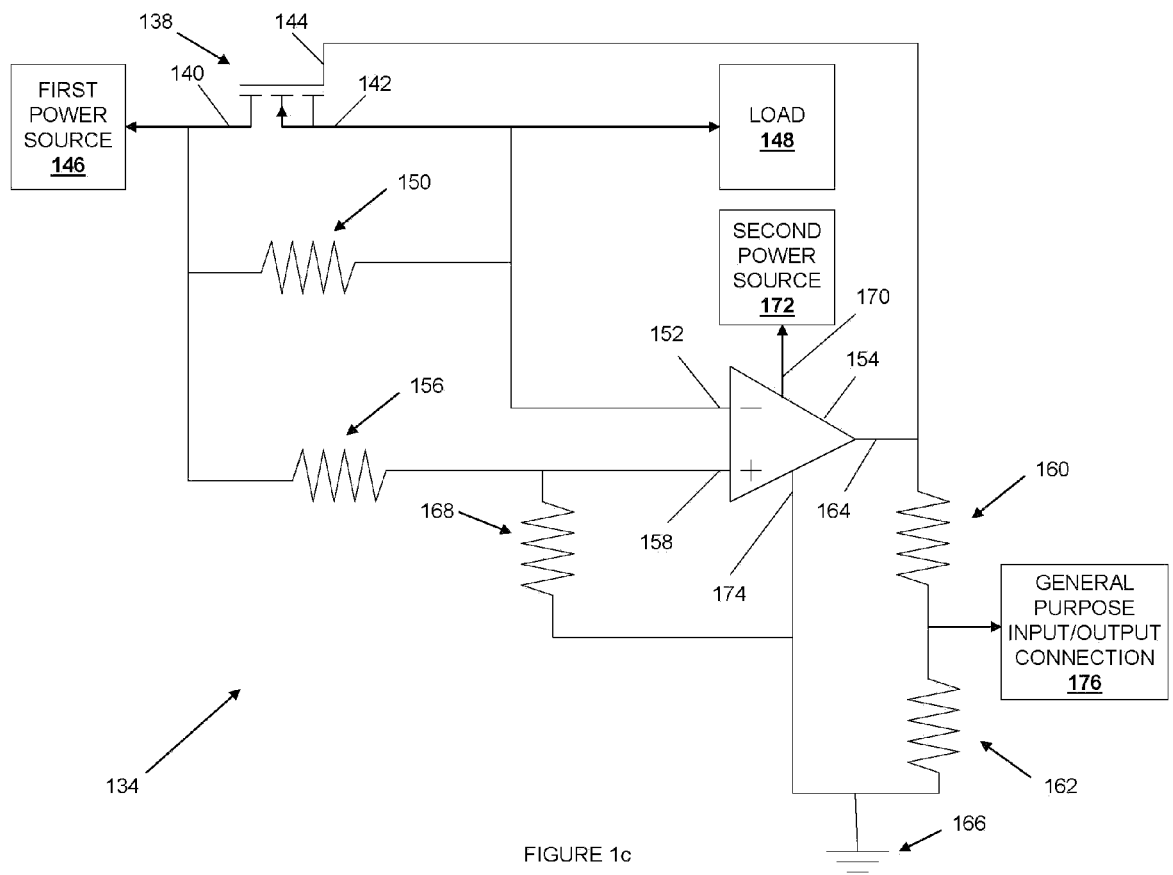
FIG. 1c is a schematic view illustrating an embodiment of a port monitoring module included in the port security switch of FIG. 1b.
Figure 2:
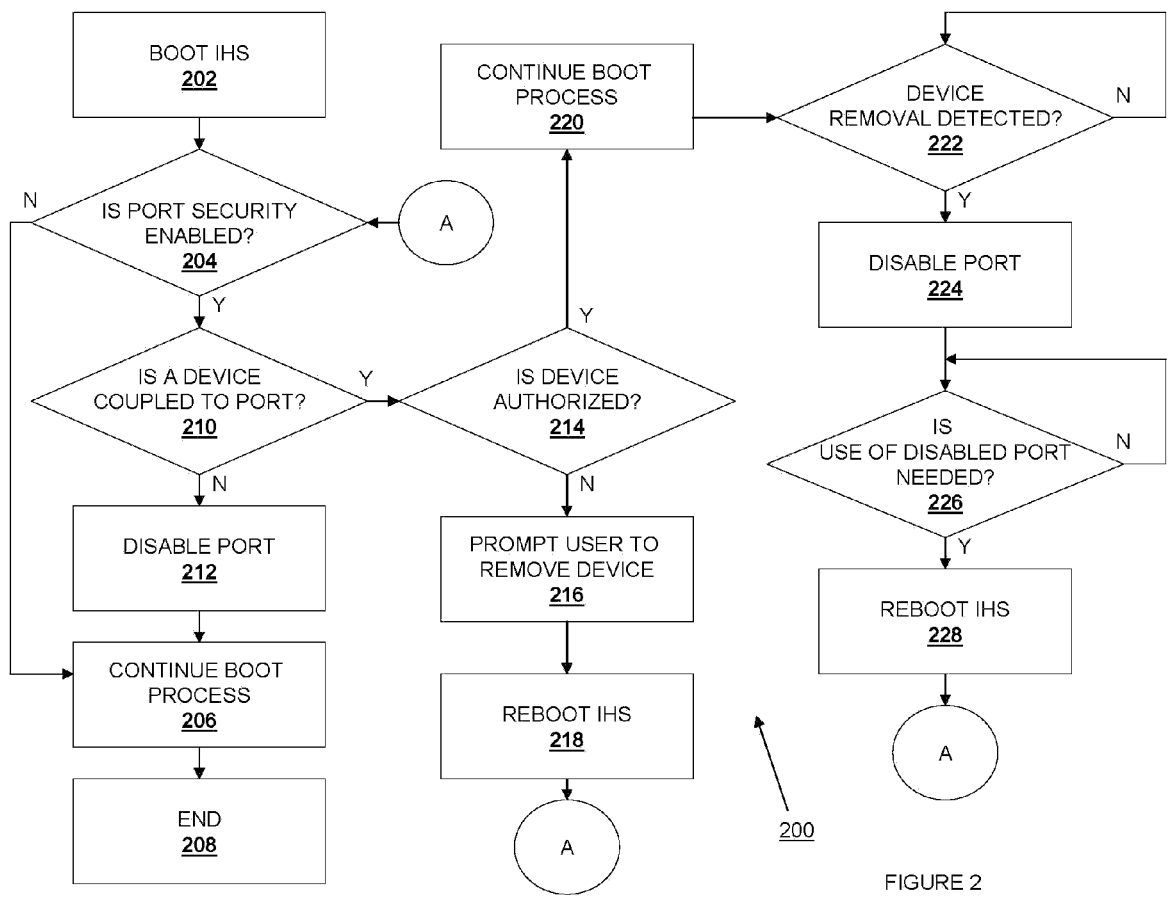
FIG. 2 is a flow chart illustrating an embodiment of a method to secure a port on an IHS.

Referring now to FIG. 1c, an embodiment of the port-monitoring module 134 is illustrated in more detail. The illustrated port-monitoring module 134 is directed to a port-monitoring module suitable for a USB port. The port-monitoring module 134 includes a power gate 138 having a drain 140, a source 142 and a gate 144. The drain 140 of the power gate 138 is coupled to a first power source 146. In an embodiment, the first power source 146 may be a 5-volt power source (e.g., the USB standard power source.) The source 142 of the power gate 138 is coupled to a load 148 (e.g., the Vcc of the port 122). A resistor 150 is coupled, in parallel, to the drain 140 and the source 142 of the power gate 138. In an embodiment, the resistor 150 may be a 10-ohm resistor. An inverting input 152 of an operational amplifier (op-amp) 154 is coupled in series to the source 142 and the resistor 150. A resistor 156 is coupled in series between the drain 140 and a non-inverting input 158 of the op-amp 154. In an embodiment, the resistor 156 may be a 1000-ohm resistor. A resistor 160 and a resistor 162 are coupled in series between the output 164 of the op-amp 154 and a ground 166. In an embodiment, the resistors 160 and 162 may be 10000-ohm resistors. A resistor 168 is coupled between the non-inverting input 158 of the op-amp 154 and the ground 166. In an embodiment, the resistor 168 may be a 49900-ohm resistor. A power connection 170 of the op-amp 154 is coupled to a second power source 172. In an embodiment, the second power source 172 may be a 12-volt power source. However, the second power source 172 may be any power source that provides a greater amount of voltage than the first power source 146 in order to enable the activation of the power gate 138. A ground connection 174 of the op-amp 154 is coupled to the ground 166. A General Purpose Input/Output (GPIO) connection 176 is coupled between the resistors 160 and 162. In an embodiment, the value of the resistors 160 and 162 may be selected such that they reduce the output voltage of the op-amp 154 to a voltage that is usable by the GPIO connection 176. While the port monitoring module 134 has been illustrated as a port monitoring module suitable for a USB port, one of skill in the art will recognize that modifications to the components (e.g., different values for the resistors 150, 156, 160, 162 and 168) and the addition of different components (e.g., capacitors) may be used to optimize the port monitoring module 134 for a given USB port or to modify the port monitoring module 134 for use with an ESATA port, a PS/2 port, a Firewire port, and/or a variety of other I/O ports known in the art for which security may be desired.

In the illustrated embodiment of the port-monitoring module 134, the op-amp 154 may be used to monitor the current drawn by the load 148 to determine whether that current is greater than a predetermined threshold current. In an embodiment, the predetermined threshold current is the current at which, over that current, the voltage drop across the circuit will result in the load 148 not receiving adequate power. In an embodiment, the value of predetermined threshold current may be adjusted by adjusting the value of the resistor 150 used in the port-monitoring module 134. For example, the predetermined threshold current is may be 10 mA with a 10-ohm resistor used as resistor 150. If the current drawn by the load 148 is less than the predetermined threshold current, the op-amp 154 outputs a zero (ground) at the output 164, deactivating the power gate 138, and thus the entirety of the current drawn by the load 148 flows through the resistor 150. In such a case, an output of logic zero is seen at the GPIO connection 176, indicating that there is not a device inserted in the port 122. As the current drawn by the load 148 increases beyond the predetermined threshold current, the op-amp 154 outputs an increasingly positive voltage at the output 164, activating the power gate 138, resulting in some current flow through the resistor 150 and the remainder of the current flow through the power gate 138. In such a case, the power gate 138 may be said to be functioning similar to a voltage regulator by maintaining the voltage drop across the resistor 150 established by the predetermined threshold current. Also, an output of logic one will be seen at the GPIO connection 176, indicating that there is a device coupled to the port 122.

For example, as discussed above, the first power source 146 may be 5 volts, the second power source 172 may be 12 volts, the resistor 150 may be a 10 ohm resistor, the resistor 156 may be a 1000 ohm resistor, the resistors 160 and 162 may be 10000 ohm resistors, and the resistor 168 may be a 49900 ohm resistor. In such a situation, when the current drawn by the load 148 is less than 10 mA, the op-amp 154 outputs a zero (ground) at the output 164, causes the power gate 138 to be turned off, and the entirety of the current drawn by the load 148 flows through the resistor 150. The zero (ground) output of the op-amp 154 seen by the GPIO connection 176 indicates that there is no device coupled to the port 122. However, when the current drawn by the load 148 increases beyond 10 mA, the op-amp 154 outputs a logic one at the output 164 and causes the power gate 138 to be turned on, resulting in 10 mA of current flowing though the resistor 150 (along with the corresponding 100 mV voltage drop) and the remainder of the current flowing through the power gate 138, thereby supplying the load 148 with 4.9 volts. The logic one output of the op-amp 154 seen by the GPIO connection 176 indicates that there is device coupled to the port 122.

Conventionally, when it is desired to monitor for a small current draw by a load, a simple DC current sensor using a resistor and an op-amp is used. Current flow to the load causes a voltage drop across the resistor that is detected by the op-amp. However, when the load draws a large current relative to the size of the current draw being monitored, the voltage drop across the resistor can disturb the function of the circuit by supplying too little voltage to the load. Thus, a port-monitoring module 134 has been described that allows the monitoring of a port for a relatively small current draw even when the load that is typically coupled to that port draws a relatively much larger current, while supplying such a load with adequate voltage when it is coupled to the port.

Referring now to FIGS. 1a, 1b, 1c and 2, an embodiment of a method 200 to secure a port is illustrated. The method 200 begins at block 202 where the IHS 100 is booted. The method 200 then proceeds to decision block 204 where is it determined whether port security is enabled for the port 122. Using methods known in the art, it may be determined whether the port security has been enabled for the port 122. In an embodiment, the port security may be enabled or disabled in the BIOS setup by a system administrator. Then, for example, during a power-on self-test (POST) of the IHS 100, the port controller 120 may receive a command from the BIOS to enable or disable the port 122.

If, at decision block 204, it is determined that the port security for port 122 is not enabled, the method 200 proceeds to block 206 where the IHS boot process is continued. In an embodiment, the continued boot process of block 206 results in the loading of the operating system such that the user may use the IHS 100 as is known in the art. The method 200 then ends at block 208. If, at decision block 204, it is determined that the port security for port 122 is enabled, the method 200 then proceeds to decision block 210 where it is determined whether a device is coupled to the port 122. In an embodiment, the BIOS is operable to determine whether a device is coupled to the port 122. If, at decision block 210, it is determined that a device is not coupled to the port 122, the method 200 then proceeds to block 212 where the port 122 is disabled. The BIOS sends a command to the port controller 120 to disable the port 122. In an embodiment, a notification may be sent to the user of the IHS 100 that the port 122 has been disabled. In an embodiment, there may be no notification sent to the user of the IHS 100 that the port has been disabled. In an embodiment, a variety of other configurations and methods known in the art may be used to detect the presence of a device coupled to the port 122 and/or disable the port 122. The method 200 then proceeds to blocks 206 and 208 where the IHS booting process is continued and the method 200 ends, respectively, as described above.

If, at decision block 210, it is determined that a device is coupled to the port 122, the method 200 then proceeds to decision block 214 where it is determined whether the device is authorized. In an embodiment, the system administrator and/or a manufacturer of the IHS 100 may specify one or more authorized devices and/or unauthorized devices for the port 122. In an embodiment, the authorized devices may include all keyboards, mice, and/or a variety of other input devices known in the art. In an embodiment, the unauthorized devices may include all devices other than keyboards, mice, and/or a variety of other input devices known in the art. In an embodiment, there may be a plurality of additional ports such as, for example, the ports 128 and 130, each of which may be configured by the system administrator to be secure, unsecure, or disabled. One of skill in the art will recognize the variety of other devices and types of devices may be authorized or unauthorized in accordance with the present disclosure. The BIOS is operable to determine the type of device that is coupled to the port 122 and compare that to the authorized and unauthorized devices for the port 122. If, at decision block 214, it is determined that the device is not authorized, the method 200 proceeds to block 216 where the user of the IHS is prompted to remove the unauthorized device. The method 200 then proceeds to block 218 where the IHS is rebooted and then back to decision block 204. If the user did not removed the unauthorized device as prompted in block 216, the method 200 will proceed to decision block 210 and 214 as described above. At decision block 214, the unauthorized device will again be detected and the method 200 will continue to loop through to the rebooting of the IHS at block 218 until the unauthorized device has been removed.

If, at decision block 214, it is determined that the device coupled to the port 122 is authorized, the method 200 proceeds to block 220 where the IHS boot process is continued. In an embodiment, the continued boot process of block 220 results in the loading of the operating system such that the user may use the IHS 100 as is known in the art. In an embodiment, the continued boot process of block 220 results in the BIOS losing control of the port 122 and the operating system of the IHS 100 taking control of the port. The method 200 then proceeds to decision block 222 where it is determined whether the authorized device coupled to the port 122 is removed. In an embodiment, the port monitoring module 134 may determine whether a device (not illustrated) is coupled into the port 122 by detecting whether current flowing to the port 122 (e.g., the load 148 of FIG. 1c) is above the predetermined threshold, discussed above. In an embodiment, a variety of other configurations and methods known in the art may be used to detect the presence of a device coupled to the port 122, enable the port 122, and/or disable the port 122. If, at decision block 222, it is determined that the device has not been removed from the port 122, the method 200 continues to monitor for the removal of the authorized device from the port 122. If, at decision block 222, it is determined that the authorized device has been removed from the port 122, the method 200 proceeds to block 224 where the port 122 is disabled. The port-monitoring module 134 sends a signal from the GPIO connection 176 to the port control module 136 that there is no device coupled to the port 122, discussed above. The port control module 136 may then send a command to the port controller 120 to disable the port 122 by, for example, triggering a port over-current in the port controller 120, turning off the power to the port 122, generating a system management interrupt, and/or by using a variety of other port disabling methods known in the art. In an embodiment, the port control module 136 sends hardware signals to the port controller 120 to disable the port 122 such that the port 122 is disabled and cannot be reset unless the IHS 100 is rebooted. In an embodiment, a notification may be sent to the user of the IHS 100 that the port 122 has been disabled. In an embodiment, there may be no notification sent to the user of the IHS 100 that the port has been disabled.

The method 200 then proceeds to decision block 226 where it is determined whether the use the disabled port is needed. In an embodiment, the user of the IHS 100 may determine that the disabled port is needed. If, at decision block 226, no use of the disabled port is needed, the method 200 continues to determine whether the use the disabled port is needed. If, at decision block 226, use of the disabled port is needed, the method 200 proceeds to block 228 where the IHS is rebooted. In an embodiment, the user of the IHS 100 must reboot the IHS to reset the security on the port 122 in order to allow use of the port 122 after it has been disabled. After reboot, the method 200 then proceeds to decision block 204 to again determined whether port security is enabled and the method 200 proceeds as described above.

In an embodiment, the features of the present disclosure may function independent of the operating system of the IHS. In an embodiment, the operating system of the IHS may not be able to takeover and/or override the disablement of a port. In an embodiment, the features of the present disclosure may be independent of hardware chipsets (e.g., Intel, NVDIA, AMD, ATI, VIA). While the description above was directed at a single port-securing module 118 securing a single port 122, the disclosure is not so limited. In an embodiment, a plurality of ports on an IHS may each include a dedicated port-securing module. In an embodiment, a single port securing module (e.g., port securing module 126) may control a plurality of ports (e.g., ports 128 and 130) by either being operable to disable each port separately, or allowing all ports to be disabled upon a security breach (i.e., an unauthorized device being coupled to any one of the ports.) Thus, a port-securing module is provided that allows a port to be secured.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. An information handling system (IHS) comprising:
a processor;
a port and a port securing module coupled to the processor, wherein the port securing module comprises:
   a power gate that is coupled in series to a first power source and to the port;
   a resistor coupled in parallel to the power gate; and
   an operational amplifier comprising an inverting input and a non-inverting input that couple the operational amplifier in parallel to each of the power gate and the resistor, the operational amplifier also comprising an output that is operable to indicate whether a load is coupled to the port and, if a load is coupled to the port, to supply a voltage to activate the power gate such that power is supplied to the port; and
a memory coupled to the processor, the port, and the port securing module, wherein the memory comprises computer-readable instructions that are processable by the processor, and wherein one of the computer-readable instructions, the port securing module, and the combination of the computer-readable instructions and port securing modules is operable to:
   determine that security for the port is enabled upon the booting of the IHS;
   detect whether a device is coupled to the port and disable the port if a device is not coupled to the port;
   determine, upon detecting that a device is coupled to the port, whether the device is an authorized device and either reboot the IHS if the device is an unauthorized device or allow the use of the device through the port if the device is an authorized device; and
   monitor for the removal of the authorized device from the port and allow the use of the authorized device through the port if the removal of the authorized device is not detected.

2. The IHS of claim 1, wherein one of the computer-readable instructions, the port securing module, and the combination of the computer-readable instructions and port securing modules is operable to:
disable the port if removal of the authorized device from the port is detected.

3. The IHS of claim 2, wherein one of the computer-readable instructions, the port securing module, and the combination of the computer-readable instructions and port securing modules is operable to:
require re-booting of the IHS when the use of the disabled port is needed.

4. The IHS of claim 1, wherein the memory comprises computer-readable instructions that are operable to:
prompt for the removal of the unauthorized device from the port if it is determined that the device is an unauthorized device.

5. The IHS of claim 1, wherein the port comprises a Universal Serial Bus (USB) port.

6. The IHS of claim 1, wherein the resistor comprises a resistance that determines a predetermined threshold current such that when a load coupled to the port draws a current below the predetermined threshold current, the output of the operational amplifier is operable to indicate that no load is coupled to the port, and when a load coupled to the port draws a current that is increasingly greater than the predetermined threshold current, the operational amplifier is operable to indicate that a load is coupled to the port and supply an increasingly positive voltage to the port.

7. The IHS of claim 1, further comprising:
a second power source coupled to the operational amplifier, wherein the second power source provides a greater voltage than the first power source.

8. The IHS of claim 1, further comprising:
a port controller coupled to the port and operable to disable the port such that the port may not be enabled without the re-booting of the IHS.

9. A method to secure a port, comprising:
determining that security for a port on an information handling system (IHS) is enabled upon the booting of the IHS;
detecting whether a device is coupled to the port by determining that a current flowing to the port is below a predetermined threshold, wherein if the device is not coupled to the port, the port is disabled;
determining, upon detecting that the device is coupled to the port by determining that the current flowing to the port is above the predetermined threshold, whether the device is an authorized device, wherein if the device is an unauthorized device, the IHS is rebooted, and wherein if the device is an authorized device, the use of the authorized device through the port is allowed and a power gate that is coupled to the port is turned on, in response to the current flowing to the port being above the predetermined level, in order to supply a voltage to the port to power the authorized device; and
monitoring for the removal of the authorized device from the port by determining that the current flowing to the port is below the predetermined threshold, wherein if no removal of the authorized device from the port is detected, the use of the authorized device through the port is allowed.

10. The method of claim 9, wherein if removal of the authorized device from the port is detected, the port is disabled.

11. The method of claim 10, wherein the port is disabled such that the port may not be enabled without the re-booting of the IHS.

12. The method of claim 10, wherein the disabling of the port is independent of the operating system and the hardware chipset of the IHS.

13. The method of claim 10, further comprising:
re-booting the IHS when the use of the disabled port is needed.

14. The method of claim 9, further comprising:
generating a prompt to remove the device from the port if it is determined that the device is an unauthorized device.

* * * * *